United States Patent [19]
Tanaka

[11] Patent Number: 5,951,709
[45] Date of Patent: Sep. 14, 1999

[54] RADIO COMMUNICATION SYSTEM USING TDD SCHEME

[75] Inventor: Hirokazu Tanaka, Chiba, Japan

[73] Assignee: Kabushiki Kaisha Toshiba, Kawasaki, Japan

[21] Appl. No.: 08/607,663

[22] Filed: Feb. 27, 1996

[30]     Foreign Application Priority Data

Feb. 28, 1995   [JP]   Japan ..................................... 7-039652

[51] Int. Cl.⁶ .......................... H03M 13/00; H04B 7/185; H04J 3/00
[52] U.S. Cl. .......................... 714/755; 370/280; 370/316; 714/776
[58] Field of Search ................................. 371/37.1, 37.4, 371/37.01, 37.06, 37.02; 370/280, 316

[56]             References Cited

U.S. PATENT DOCUMENTS

| 5,181,209 | 1/1993 | Hagenauer et al. | 371/43 |
| 5,384,782 | 1/1995 | Elms | 371/2.1 |
| 5,473,601 | 12/1995 | Rosen et al. | 370/319 |
| 5,539,730 | 7/1996 | Dent | 370/29 |
| 5,603,079 | 2/1997 | Olds et al. | 455/13.1 |
| 5,668,556 | 9/1997 | Rouffet et al. | 342/354 |

OTHER PUBLICATIONS

Deng et al., "High Rate Concatenated Coding Systems Using Bandwidth Efficient Trellis Inner Codes", IEEE Transaction on Communications, vol. 37, No. 5, May 1989, pp. 420–421.

D'Aria et al., "Simulation and Peformance of the Pan–European Land Mobile Radio System", IEEE Transactions on Vehicular Technology, vol. 41, No. 2, May 1992, pp. 177–178.

Fakhouri et al., "Performance Evaluation of Multiple Access Techniques in Land Mobile Satellite Networks", IEEE Transactions on Vehicular Technology, vol. 41, No. 3, Aug. 1992, pp. 226–230.

*Primary Examiner*—Stephen M. Baker
*Attorney, Agent, or Firm*—Finnegan, Henderson, Farabow, Garrett & Dunner, L.L.P.

[57]             ABSTRACT

The system in this invention is provided with a ground radio channel for performing the radio communication by directly connecting between base stations and mobile stations, and a satellite radio channel for performing the radio communication by connecting the base stations and mobile stations via communication satellite. When a mobile stations performs communication, which ever of said ground radio channel or satellite radio channel is selected. Moreover, when a ground radio channel is selected in accordance with the selection of this radio channel, the block code prioritizing the error correction capability is set to the channel codec so as to perform the correction is encoding and decoding process prioritizing the error correction capability. As contrast to that, when a satellite radio channel is selected, the block code prioritizing the erasure code correction capability is set to the channel codec so as to perform the error correction encoding and decoding process prioritizing the erasure code correction.

12 Claims, 11 Drawing Sheets

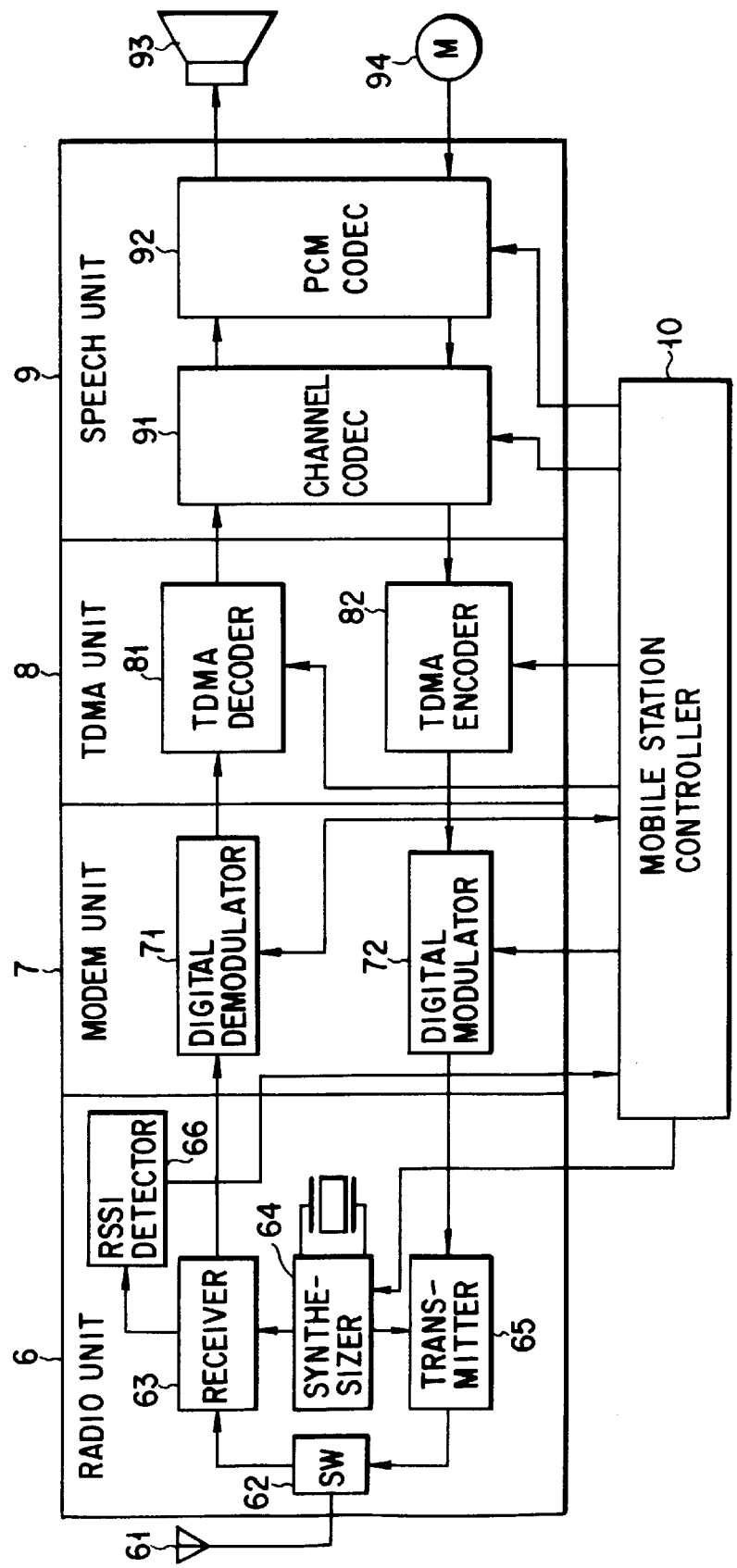
F I G. 3

| NUMBER OF ERASURE CODE CORRECTION | NUMBER OF ERROR CORRECTION |
|---|---|
| 0 | 7 |
| 2 | 6 |
| 4 | 5 |
| 6 | 4 |
| 8 | 3 |
| 10 | 2 |
| 12 | 1 |
| 14 | 0 |

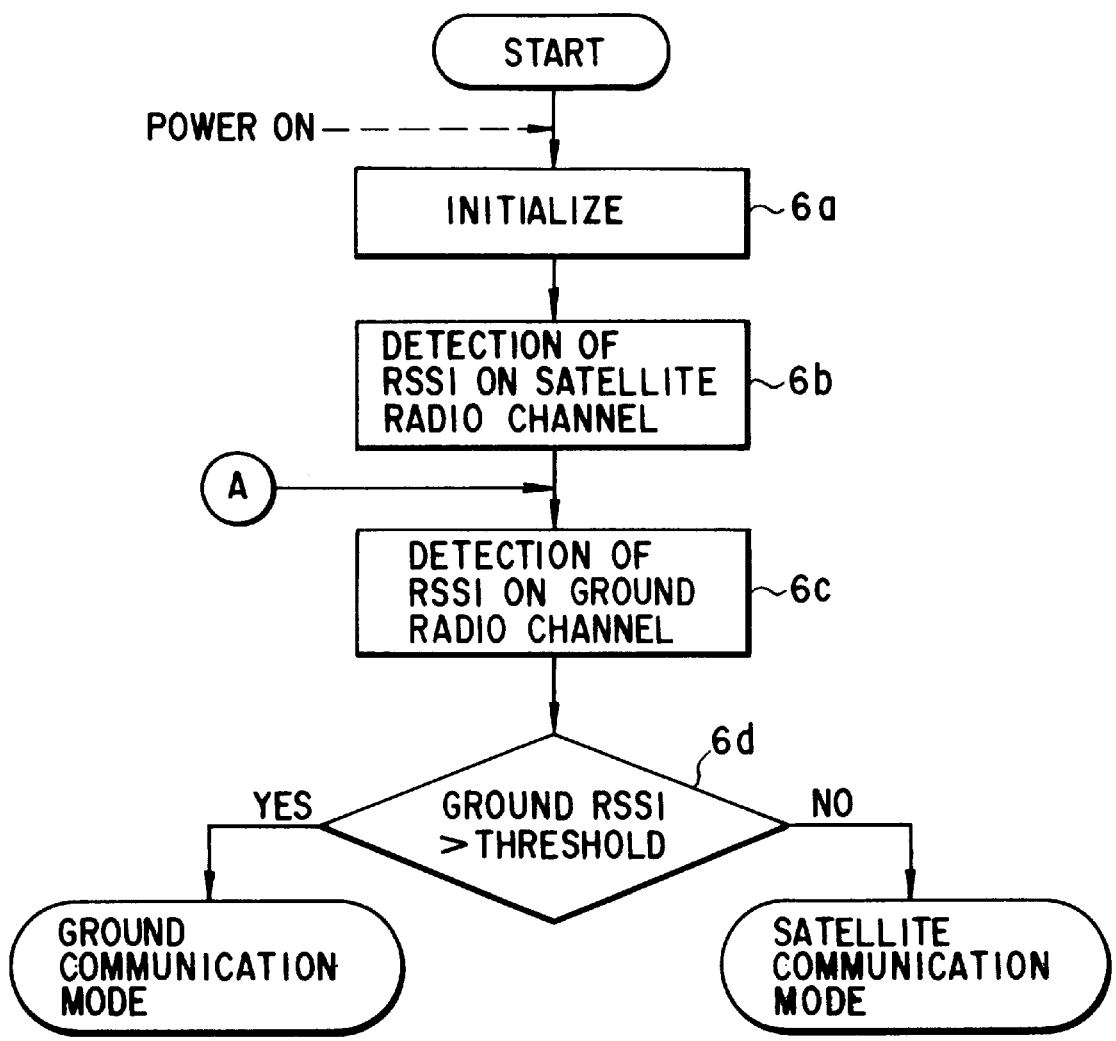
F I G. 6

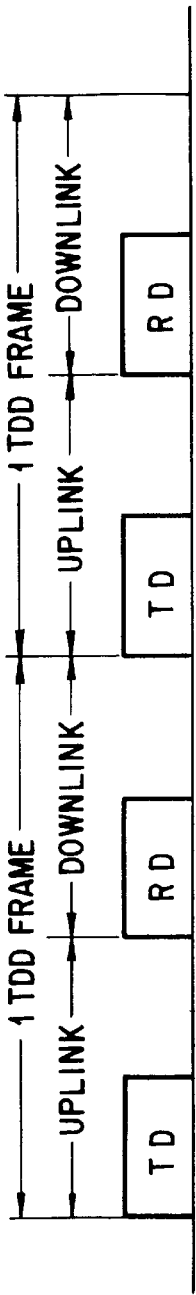
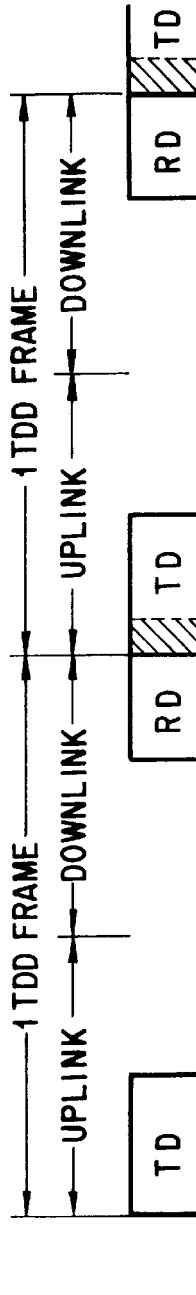
F I G. 9A
F I G. 9B
F I G. 10A
F I G. 10B

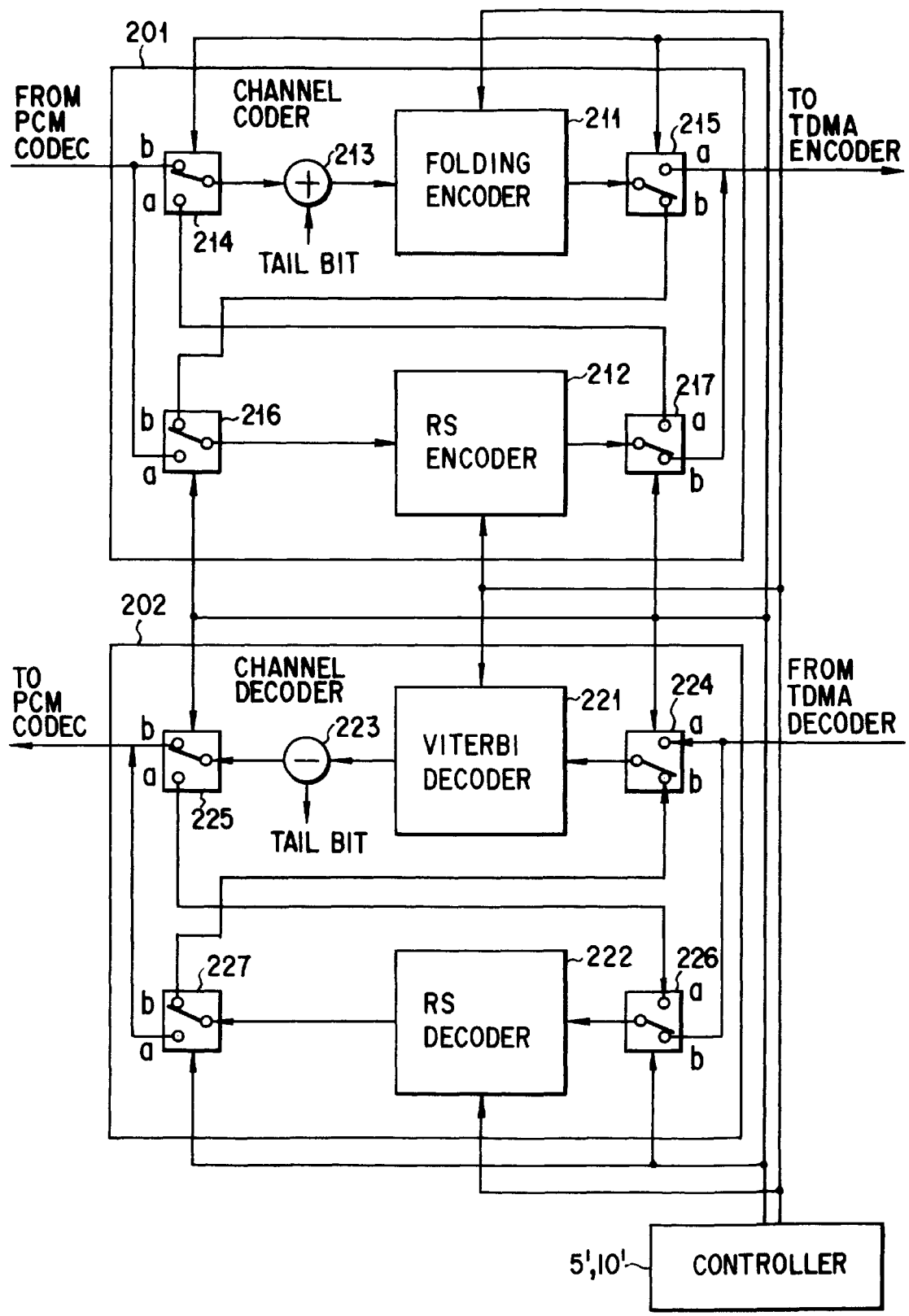
F I G. 11

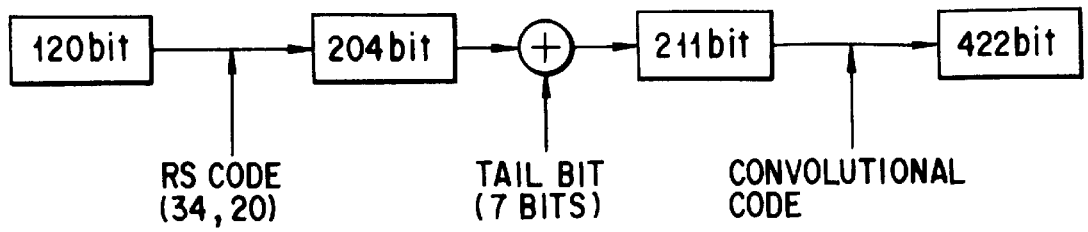
F I G. 12A   WHEN USING GROUND RADIO CHANNEL
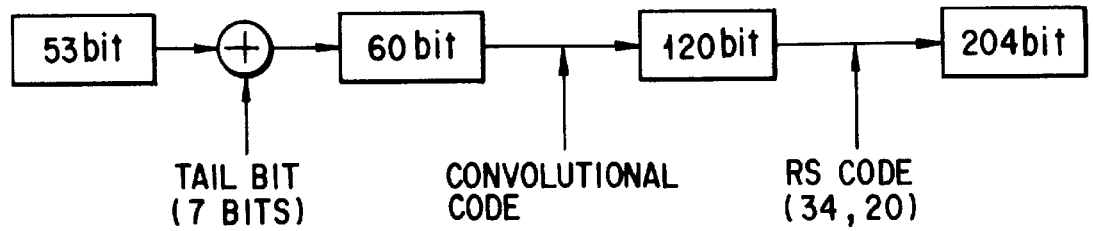
F I G. 12B   WHEN USING SATELLITE RADIO CHANNEL
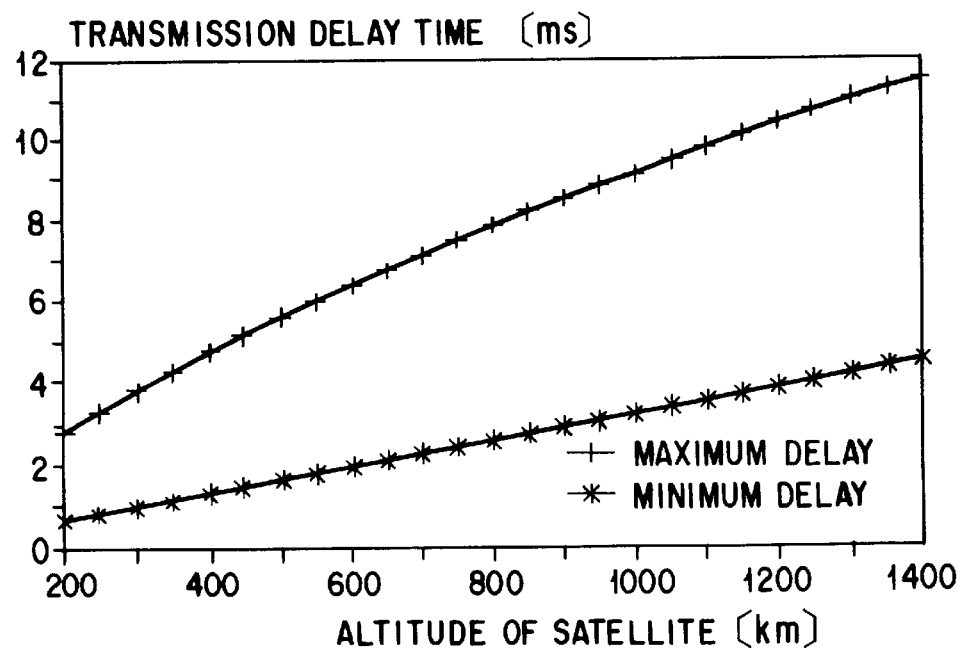
F I G. 14

RADIO COMMUNICATION SYSTEM USING TDD SCHEME

BACKGROUND OF THE INVENTION

1. Field of the Invention

This invention relates to a radio communication system such as a digital cellular phone communication system and digital radio LAN, especially, to a system using TDD scheme as a radio access scheme.

2. Description of the Related Art

For example, in a digital mobile communication (cellular phone) system, FDD (Frequency division duplex) scheme and TDD (Time division duplex) scheme are used as a radio access scheme between the base station and mobile station. FDD scheme allows the full duplex communication by allocating a different radio carrier frequency to an uplink directed from the mobile station to a base station and to a downlink directed from the base station to the mobile station. Conversely, TDD scheme allows the full duplex communication by allocating a different time slot on the same radio carrier frequency to the uplink and the downlink.

FDD scheme must always maintain a pair of radio carrier frequencies. However, it is not required by the TDD scheme, thereby eliminating a duplexer with enhanced frequency utilization efficiency. Moreover, the TDD scheme has approximately the same radio propagation conditions, with an advantage of simplifying the configuration for diversity communication. For such reasons, the TDD scheme has been extensively applied to PHS (Personal Handy Phone System) and DECT (Digital European Cordless Telecommunications) in the digital mobile communication system.

Meanwhile, recently, a satellite-base mobile communication system has been proposed in which the radio communication between mobile stations or between a mobile station and base station is established via a communication satellite. This system is capable of covering a vast service area in comparison with the ground base mobile communication system. However, the satellite-base mobile communication system generally uses the FDD scheme as a radio access scheme and does not use the TDD scheme. The reason of this is as follows:

Thus, the TDD scheme alternately performs the sending and receiving operation so that it is necessary to accurately control the switching timing. In contrast to this, the satellite-base mobile communication system mainly uses a satellite moving along a low-altitude orbit. When a radio communication is established between mobile stations via an orbiting satellite, two-to three-folds difference will appear in a propagation delay time due to the position of the orbiting satellite. FIG. 14 shows the change in the propagation delay with respect to the altitude of the communication satellite. For example, suppose that there is a mobile station communicating with an orbiting satellite at the altitude of 1000 km. In this instance, the propagation delay time will be approximately 3.2 msec when the satellite is positioned just above the mobile station, namely, the distance between the mobile station and the satellite is the shortest, and on the other hand, the time will be 9 msec when the satellite is positioned on a horizontal point as viewed from the mobile station, namely, the distance between the mobile station and the satellite is the most distant. Thus, the propagation delay time between the mobile station and satellite will be up to three times longer depending on the position of the satellite. In addition to that, the time required for the satellite to move from the horizontal position viewed from the mobile station to the position just above the mobile station is only a few minutes. Moreover, the satellite-base mobile communication system is closely described, for example, in the document "Satellite Communications-Mobile and Fixed Service" written by M. J. Miller, D. Vacetic, L. Berry.

Thus, when one tries to apply the TDD scheme to the satellite-base mobile communication system whose propagation delay time changes extensively during communication, it makes necessary to accurately control the switching timing between the sending and receiving on the mobile station and satellite, with said propagation delay time taken into consideration, thereby making it very difficult to control the timing.

Moreover, it is conceivable to provide a large guard time between the sending time slot and the receiving time slot to simplify or dispense with the control of switching timing with said propagation delay time took into consideration. However, it does not provide an effective means since enlarged guard time results in the reduction in the propagation efficiency.

SUMMARY OF THE INVENTION

The purpose of this invention is to allow a high quality radio communication without accurate timing control and large guard time, thereby providing a TDD radio communication system capable of allowing a radio communication having favorable efficient propagation efficiency only with simple control even if there is a large change with the passage of time in the propagation delay time.

To achieve this purpose, the system and radio communication apparatus in this invention is characterized by that, when sending a series of digital information, a radio station encodes the series of input digital information by using error correction code having a predetermined erasure signal correction capability, sends the encoded series of digital information to a radio channel during a specified sending period after digital-modulation of it, and, when receiving and reproducing the series of digital information, performs a signal erasure correction process on the modulated signals based on the correction codes after receiving and demodulating the radio signals arrived during a specified receiving period via the radio channel so as to restore the information having vanished without being received during the receiving period.

Therefore, according to this invention, the receiving slot and the sending slot overlap partially so that, even if a part of the digital transmission information is erased without being received, that erased information will be restored by the erasure signal correction process. For that reason, even in a system having a large change with the passage of time in the propagation delay time such as a case where the radio communication is established via an orbiting satellite, it is possible to accurately transmit a series of digital information without accurately controlling the sending timing and providing a large guard time. Namely, it is possible to perform an effective radio transmission with only a simple control operation.

Furthermore, this invention is characterized by that, when sending a series of digital information, a radio station performs the error correction encoding operation on the series of input digital information by using a first error correction code having a predetermined error correction capability, than, sends the information after encoding the information by using a second error correction code having a predetermined erasure signal correction capability, and, when receiving and reproducing the series of digital information, the station restores the erasure information by performing the erasure signal correction process on the demodulation signals on the basis of the second error correction code at first and then, performs the error correction decoding on the series of the erasure signal-corrected signals by using the first error correction code.

Therefore, the erasure information is restored and further the error is corrected so that it is possible to further enhance the transmission quality of the series of digital information.

Furthermore, the system in this invention is characterized by providing the radio station with encoding process and erasure signal correction decoding process functions to restore the erasure digital information and also providing the orbiting satellite that relays the radio communication between the radio stations with the erasure signal correction decoding process required for restoring the erasure digital information and decoding process functions.

Therefore, the process for restoring the erasure information is performed when the transmitted information is relayed via the orbiting satellite so that it is possible to transmit the series of digital information more securely than the case where the erasure signal correction process is performed only by the ground radio stations.

Further, this invention provides a mobile station and a ground station with a radio channel selection means that selects whether the communication should be conducted via a ground-system radio channel or via a satellite-system radio channel in a system equipped with a ground-system radio channel for conducting the radio communication by directly connecting between the base station and a mobile station as well as a satellite-system radio channel for conducting the radio communication by connecting between the base station and a mobile station or between mobile stations via an orbiting satellite, and, when the ground-system radio channel is selected by this radio channel selection means, the first error correction code that prioritizes the error correction capability is selected to perform the encoding process and correction decoding process prioritizing the error correction. On the other hand, when the satellite-system radio channel is selected, the encoding process and decoding process for erasure signal correction by using this second error correction code are conducted.

Therefore, when a radio communication is conducted by using a satellite-system radio channel where the transmitted information is easily erasure, the error correction encoding and decoding process prioritizing the erasure signal correction is performed, thereby making it possible to restore the erasure information as many as possible even if the information is erasure. Thus, it is possible to accurately transmit the series of digital information without accurately controlling the transmission timing even if the radio communication is conducted via an orbiting satellite and without providing a large guard time. On the other hand, when the radio communication is conducted by using a ground-system radio channel having relatively low loss of information, the error correction encoding and error correction decoding process prioritizing the error correction, thereby making it possible to correct the erroneous codes as many as possible. Namely, according to this invention, it is possible to perform an effective error corrective transmission, with the difference in transmission characteristics of the ground-system radio channel and satellite-system radio channel took into consideration.

Moreover, this invention is characterized by that, when the radio communication is conducted by selecting the satellite-system radio channel, the erasure signal correction decoding and decoding process required for restoring the erasure digital information is conducted not only on the mobile station and ground-base station but also on the orbiting satellite-system radio channel.

Therefore, the process for restoring the erasure information is conducted when the transmitted information is relayed on the orbiting satellite, thereby making it possible to more accurately transmit the series of digital information in comparison with the case where the erasure signal correction process is conducted only with the ground-base radio station.

Moreover, this invention is characterized by that a block code is selected as an outside code and a convolutional code is selected as an inside code respectively when the ground-system radio channel is selected, that, when sending the signal, the series of input digital information is, at first, encoded by using the convolutional code, and, when receiving the signal, the signals to be decoded, at first, undergo the error correction decoding process by using a viterbi decoder, then, the series of error correction decoded signals are decoded based on the block code.

By doing so, it is possible to set the correction capability for the error of code higher, thereby allowing high quality information transmission suitable for the transmission characteristics of a ground-system radio channel.

Furthermore, this invention is characterized by that, when the satellite-system radio channel is selected, convolutional code is selected as an outside code and a block code is selected as an inside code respectively, and when sending the signals, the series of input digital information undergoes encoding process by using the convolutional code at first, and then, the series of input digital information after the encoding process is encoded by using the block code, and that, when receiving the signals, the signals to be demodulated undergo the decoding process prioritizing the erasure signal correction based on the block code, and then, this series of decoded signals undergoes the error correction decoding process by using the viterbi decoder.

By doing so, it is possible to providing the error correction capability while maintaining the erasure signal correction capability at a high level, thereby allowing high quality information transmission suitable for the transmission characteristics of a satellite-system radio channel.

Moreover, this invention is characterized by that, while the communication is conducted with the base station via a ground-system radio channel, the receiving quality of the ground-system radio channel during communication is monitored to judge whether or not the receiving quality satisfies specified conditions, and that, if the receiving quality is judged to be not satisfying the specified conditions, the ground-system radio channel is switched to the satellite-system radio channel while maintaining the communication state.

Therefore, when a mobile station goes out of the service area formed by a group of base stations, resulting in the degraded quality of the ground-system radio channel under communication, the handoff is performed from the ground-system radio channel to the satellite-system radio channel. Thus, the mobile station can continue the communication. Moreover, in response to the handoff, the error correction encoding and decoding process on the transmitting information is switched from a process prioritizing the error correction capability to a process prioritizing the erasure signal correction. Thus, it is possible to perform a high-quality transmission even after the handoff, preventing the loss of information.

Moreover, this invention is characterized by that, while the communication is conducted with a satellite-system radio channel, the receiving quality of the ground-system radio channel is measured to judge the presence of a ground-system radio channel whose receiving quality satisfies specified conditions on the basis of this measurement results, and, when the receiving quality is judged to prove that there is a ground-system radio channel that satisfies the specified conditions, the satellite-system radio channel under communication is switched to the ground-system radio channel.

Therefore, if the quality of the ground-system radio channel is restored during communication via the satellite-system radio channel, handoff is performed from the satellite-system radio channel to the ground-system radio channel. This is very effective when the number of the satellite-system radio channels is less than that of the ground-system radio channels.

Furthermore, this invention is characterized by that, while a communication is conducted with a base station via the ground-system radio channel, the receiving quality of the ground-system radio channel under communication and the ground-system radio channel on which other base station is sending a signal is monitored respectively, and then, when the receiving quality of the ground-system radio channel under communication is judged not to satisfy specified conditions and the receiving quality is judged to prove that there is another ground-system radio channel that satisfies specified conditions, the ground-system radio channel under communication is switched to another ground-system radio channel, on the other hand, when the receiving quality is judged to prove that there is no other ground-system radio channel that specifies the specified conditions, the ground-system radio channel under communication is switched to the satellite-system radio channel.

Therefore, the handoff to the satellite-system radio channel is performed only when no available ground-system radio channel is found, thereby making it possible to more effectively utilize the satellite-system radio channel having a limited number of the channels.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a circuit block diagram showing the configuration of the mobile station shown in FIG. 1;

FIG. 6 is a flow chart showing the procedures and contents of the initializing operation in the base station and mobile station shown in FIGS. 2 and 3;

FIGS. 9A and 9B show each format of the transmission that is sent and received when the satellite radio channel and ground radio channel are used respectively;

FIGS. 10A and 10B show an example of sending and receiving timing when the object satellite distance is minimum and is a maximum respectively;

FIG. 11 is a block diagram showing the configuration of the channel codec relating to the second embodiment;

FIGS. 12A and 12B describes the operation of the channel coding shown in FIG. 11;

FIG. 14 shows an example of the propagation delay time with respect to the altitude of the satellite.

DETAILED DESCRIPTION OF THE PREFERRED EMBODIMENTS (The first embodiment)

Figure 1:
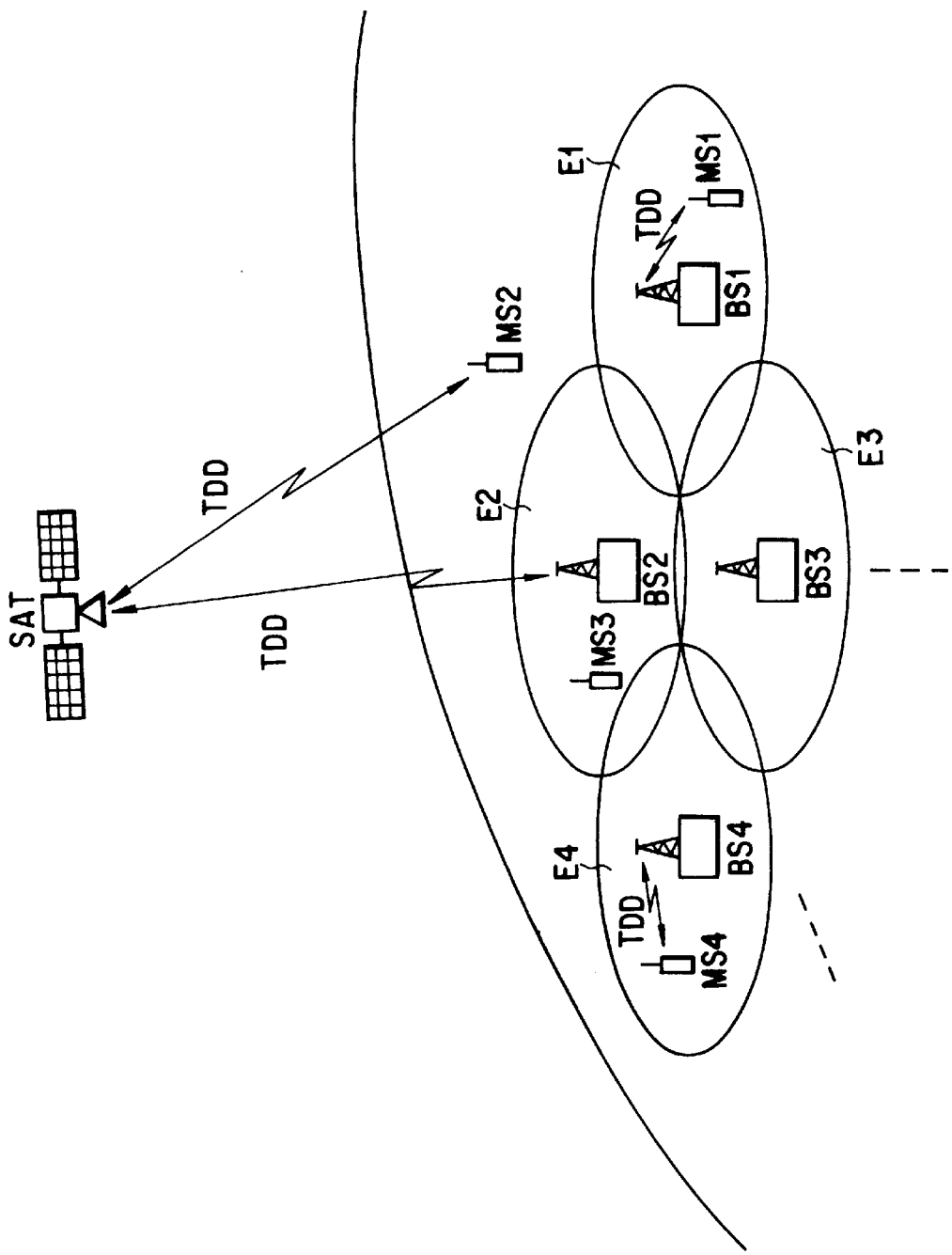
FIG. 1 is a schematic diagram of the radio communication system in the first embodiment in this invention.

FIG. 1 shows the schematic configuration of the radio communication system relating to the first embodiment of this invention.

A plurality of base stations BS1, BS2, . . . is dispersed and arranged over the ground service area. These base stations BS1, BS2, . . . form a radio zone E1, E2, . . . each called a cell. Moreover, the base stations BS1, BS2, . . . are connected to a public network (not shown here) via a wired transmission line. The mobile stations MS1, MS2, . . . are connected to the corresponding base stations BS1, BS2, . . . within said radio zone E1, E2, . . . via a ground-system radio channel and further connected from those base stations BS1, BS2, . . . to a public network via a wired transmission line. For example, TDMA-TDD scheme is used for the access scheme of said ground radio channel.

On the other hand, a plurality of communication satellites SAT is arranged on the orbit over said service area. Those communication satellites SATs are circling on said orbit with a specified cycle to cover the service area formed by the group of said base stations and the circumferential area that is not covered by this service area. The mobile stations MS1, MS2, . . . are connected to any of said base stations BS1, BS2, . . . via a satellite radio channel when it is positioned outside the service area of said base station BS1, BS2, . . . and in a area where is covered by communication satellite SAT. The satellite radio channel is formed via a transponder mounted on said communication satellite SAT. Moreover, the same TDMA-TDD scheme as that for said ground radio channel is used for the access scheme of said satellite radio channel.

Thus, the system in this embodiment can use a common TDMA-TDD scheme without using a different radio access scheme even if the mobile stations MS1, MS2, . . . and base stations BS1, BS2, . . . directly communicate by selecting a ground radio channel and even if they communicate via a communication satellite SAT by selecting a satellite radio channel.

Figure 2:
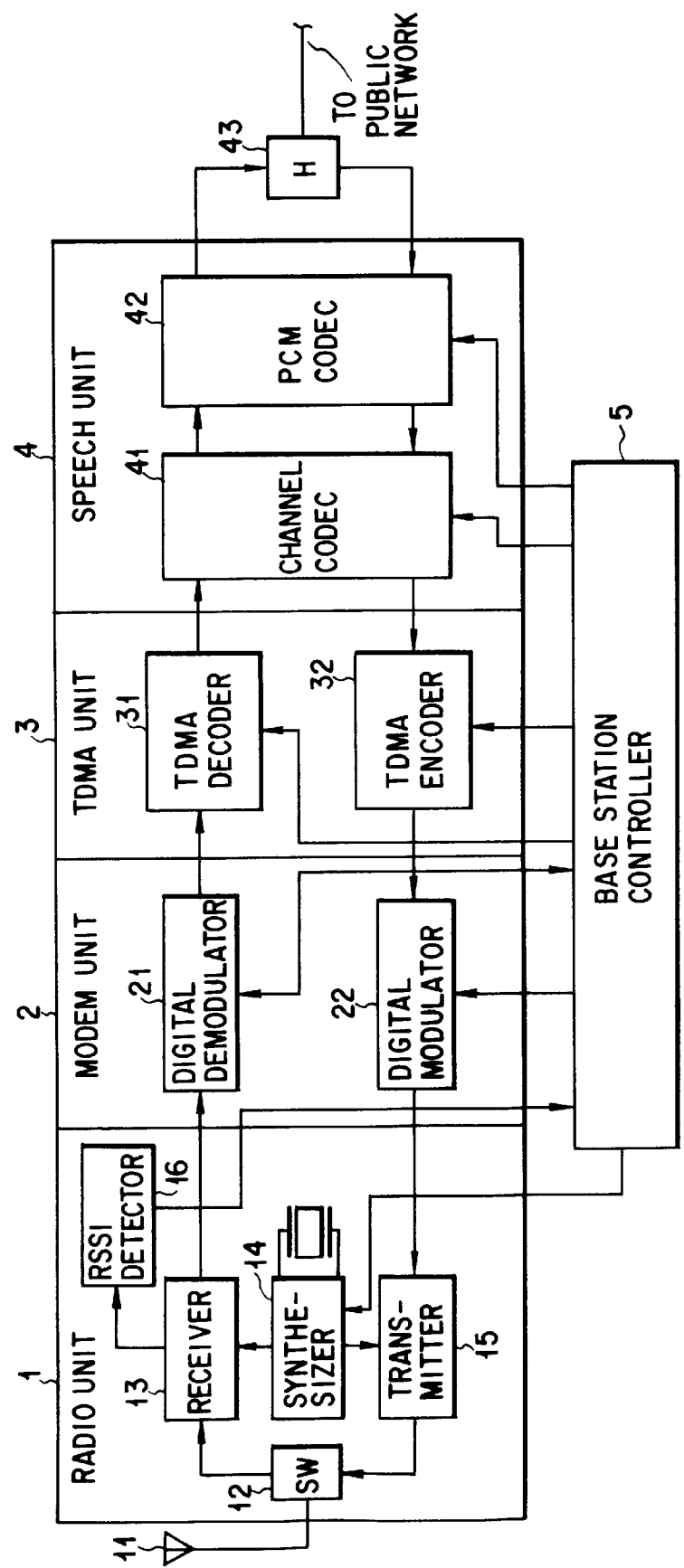
FIG. 2 is a circuit block diagram showing the configuration of the base station shown in FIG. 1.

Said base stations BS1, BS2, . . . and mobile stations MS1, MS2, . . . are configured as follows. FIG. 2 is a circuit block diagram showing the configuration of the base stations BS1, BS2, . . . , and FIG. 3 is a circuit block diagram showing the configuration of mobile stations MS1, MS2, . . .

Firstly, in FIG. 2, the radio carrier wave signal coming from the mobile stations MS1, MS2, . . . or communication satellite SAT is received by an antenna 11 and then, fed to a receiving section 13 through a high-frequency switch (SW) 12 in a radio unit 1. In this receiving section 13, said received radio carrier wave signal is mixed with a receiving local oscillation signal generated by a frequency synthesizer 14 to be down-converted into a receiving intermediate frequency signal or receiving base-band signal. Moreover, the receiving local oscillation frequency generated by said frequency synthesizer 14 is indicated by the base station control section 5. Moreover, the radio unit 1 is provided with a received field intensity (RSSI) detector 16. In this RSSI detector 16, the received field intensity of the radio carrier wave signal coming from the mobile stations MS1, MS2, . . . is detected, and the detected value is informed to the base station control section 5 to evaluate the space for the radio channel.

The received intermediate frequency signal or received base band signal is fed to a digital demodulation section 21 in a modem unit 2. In the digital demodulation section 21, said received intermediate frequency signal or received base band signal is digitally demodulated to reproduce a digital speech signal. In the TDMA decode section 31 in the TDMA unit, the digital speech signal is decomposed by each time slot in accordance with the instruction from the base station control section 5, and this decomposed digital speech signal is fed to a speech unit 4.

The speech unit 4 is provided with a channel codec 41 and a PCM codec 42. The digital speech signal fed from said TDMA decode section 31 undergoes the decoding process for error correction or erasure signal correction in said channel codec 41 and then, fed to the PCM codec 42. In this PCM codec 42, said decoded digital speech signal is converted into an analog speech signal, and then, sent to a public network (not shown here) through a hybrid circuit 43.

As contrast to this, the analog speech signal coming from the public network via a wired transmission line is converted into a digital speech signal in the PCM codec 42, and then, fed to the channel codec 41. The signal undergoes the encoding process for the error correction or erasure signal correction in the channel codec 41, and then, fed to a TDMA encoding section 32 of the TDMA unit 3.

By inserting the digital speech signal fed from said channel codec 41 into the time slot assigned to a mobile station, the TDMA encoding section 32 multiplexes the signal with the digital speech signal addressed to other mobile station so as to feed the multiplexed digital speech signal to a digital modulation section 22. In the digital modulation section 22, a modulated wave signal is obtained that is digital-modulated with said digital speech signal, and this modulated wave signal is fed to the transmission section 15. In the transmission section 15, said modulated wave signal is mixed with the transmission local oscillating signal generated from the frequency synthesizer 14 to be frequency-converted into a radio channel frequency instructed by the base station control section 5, and then, amplified to a specified transmission power level. The radio frequency signal fed from this transmission section 15 is transmitted from the antenna 11 via a high-frequency switch 12.

Then, in FIG. 3, the radio carrier wave signal coming from the base stations BS1, BS2, . . . or communication satellite SAT is received by an antenna 61 and then, fed to a receiving section 63 via a high-frequency switch (SW) 62 in a radio section 6. In this receiving section 63, said received radio carrier wave signal is mixed with the received local oscillating signal generated from frequency synthesizer 64 to be frequency-converted into a received intermediate frequency signal or received base band signal. Moreover, the local oscillating frequency generated from said frequency synthesizer 64 is instructed by the mobile station control section 10. Also, the radio unit 6 is provided with a received electric field intensity (RSSI) detector 66. This RSSI detector section 66 detects the received electric field intensity of the radio carrier wave signal coming from the base station, and the detected value is informed to the mobile station control section 10 so as to evaluate the space for the radio channel.

The received intermediate frequency signal or received base band signal fed from said receiving section 63 is fed to a digital demodulation section 71 in the modem unit 7. The digital demodulation section 71 digitally demodulates said received intermediate frequency signal or received base band signal to reproduce the digital speech signal.

The TDMA decoding section 81 in the TDMA unit 8 extracts the digital speech signal, which is inserted in the time slot assigned to the own station, from the digital speech signal fed from said digital demodulation section 71, in accordance with the mobile station control station 10 so as to feed this extracted digital speech signal to the speech unit 9. The speech unit 9 consists of a channel codec 91 and PCM codec 92. In the channel codec 91, the digital speech signal undergoes the decoding process for error correction or erasure signal correction. In the PCM codec 92, said decoded digital speech signal is converted into an analog speech signal, and this analog speech signal is amplified by a receiving speech amplifier, which is not shown in the figure, to be released from a speaker 93.

Conversely, in the speech unit 9, the sending speech fed to a microphone 94 is amplified by the sending speech amplifier, which is not shown and is converted into a digital sending speech signal by the PCM codec 92. This digital sending speech signal undergoes the encoding process for error correction or erasure signal correction in the channel codec 91, and then, fed to the TDMA unit 8. In the TDMA decoding section 82, the digital speech signal fed from said channel codec 91 is inserted to the time slot instructed by the mobile station control section 10 and fed to the digital modulation section 72. In the digital modulation section 72, the high-frequency signal is digital-modulated with said digital speech signal and a modulated wave signal is fed to the transmitting section 65 in the radio unit 6.

In the transmitting section 65, said modulated wave signal is mixed with the transmission local oscillating signal generated from the frequency synthesizer 64 to be up-converted into a radio channel frequency instructed by the mobile station control section 10, and further amplified to a specified transmission power level. The radio carrier wave signal fed from transmission section 65 is transmitted from the antenna 65 via the high-frequency switch 62.

Meanwhile, the control section 5, 10 is, for example, has a microcomputer as the main controller section, provided with a radio channel selecting function and a correction capability selecting function as the main functions relating to this invention.

The radio channel selecting function serves to evaluate whether or not there are available channels among a plurality of ground radio channels owned by the system on the basis of the RSSI of the received radio carrier wave signals during the standby period and during communication and to determine whether to use the ground-system radio channel or the satellite-system radio channel on the basis of said evaluation results when a communication request is made and handoff is required.

The correction capability selecting function serves to select a block code prioritizing the error correction capability according to the results of the selection of said radio channel selecting function if ground-system radio channel is selected when a communication request is made and handoff is required, and on the other hand, to select a block code prioritizing the erasure signal correction capability if the satellite-system radio channel is selected. For example, two kinds of block codes differing in the ratio between the number of the erasure signal correction bits and the number of the error correction bits are prepared, and any of these block codes is selected in accordance with a kind of the radio channel to be used.

Figures 4, 5:
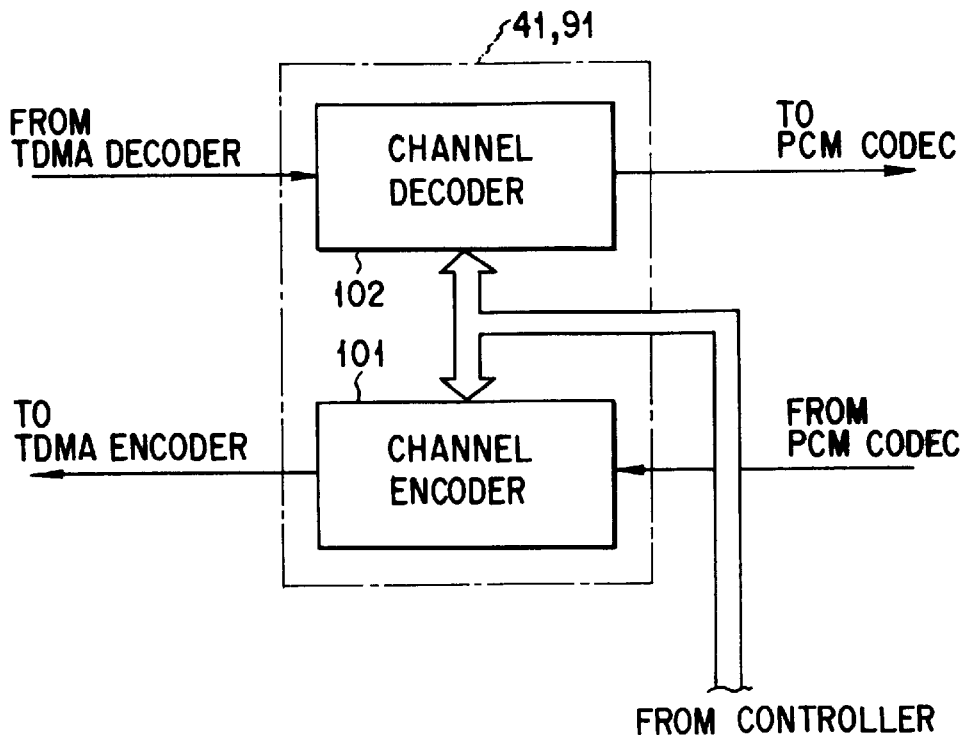
FIG. 4 is a circuit block diagram showing the configuration of the channel codec of the base station and the mobile station shown in FIGS. 2 and 3.
FIG. 5 shows an example of the combination of the erasure signal correction capability and error correction capability invention the Reed-Solomon code.

Specifically, when Reed-Solomon (34, 20) code: code length of n=34, information symbol number of k=20, minimum distance of d=15 are used as block code, there are 8 kinds of combinations of the number of erasure signal correction bits and the number of error correction bits as shown in FIG. 5. Among them, when the ground-system radio channel is used, 7 error correction or 2 erasure signal and 6 error correction is selected to improve the reliability by setting the erasure signal correction capability at a high-level. In contrast to this, when the satellite-system radio channel is used, 14 erasure signal correction and 12 erasure signal and 1 error correction is selected to serve the reproduction of the erasure signal by setting the erasure signal correction capability at a high-level.

The control section 5, 10 sets the block code having been selected by said correction capability selecting function to the channel codec 41, 91 respectively when the communication is started or handoff is conducted.

FIG. 4 shows the configuration of said each channel codec 41, 91. As shown in the same figure, the channel codec 41, 91 consists of a channel encoder 101 and a channel decoder 10. The channel encoder 101 encodes the digital sending speech signal for error correction by using the block code, consisting of Reed-Solomon encoder for example. The channel decoder 102 has a erasure signal correcting function corresponding to the error correction capability that said block code has, consisting of a Reed-Solomon decoder.

Moreover, these channel encoder 101 and channel decoder 102 are configured to be capable of selectively using a plurality of Reed-Solomon codes differing in the ratio between the number of the error correction bits and the number of erasure signal correction bits. The kinds of the Reed-Solomon codes to be used are set by said control section 5, 10.

The decoding operation in said channel decoder 102 is described below.

Euclid algorithm is used as a decoding algorithm. The euclid decoding scheme is a decoding scheme capable of performing erasure signal correction and error correction at the same time. The procedure is briefly described below.

Assuming that the minimum distance of the Reed-Solomon code on a Galois field GF ($2^m$) is indicated as d, the code length of this code n and the number of information k are expressed as below:

$$n < 2^m - 1$$

$$k = n - d + 1$$

The multinominal expression for generating this code is expressed as follows:

$$G(x) = (x-\alpha)(x-\alpha^2) \ldots (x-\alpha^{d-1})$$

Here, $\alpha$ is a source element of GF ($2^m$). With the code for the minimum distance d, "erroneous" Ne symbol and "erasure" N$\epsilon$ symbol can be corrected at the same time.

Here, $$2 \times Ne + N\epsilon \leq d-1$$

Moreover, the error whose position and magnitude are both not known is called "error" and the error whose position is only known and whose magnitude is not known is called "erasure"

The principle of the erasure signal correction and error correction decoding is briefly described below.

Supposing the transmitted code word and received word are as follows:

$$(C_{n-1}, C_{n-2}, \ldots C_0)$$

$$Ci \in GF(2^m) \; i=n-1, n-2 \ldots, 0,$$

$$(R_{n-1}, R_{n-2}, \ldots, R_0)$$

$$Ri \in GF(2^m) \; i=n-1, n-2 \ldots, 0,$$

However, assume that, among the received n- symbols, the N$\epsilon$ symbol (1 $\leq$N$\epsilon$$\leq$d-1) in position $1_{\epsilon 1}, 1_{\epsilon 2}, \ldots 1_{\epsilon Ne}$ means "erasure", and the received symbol information that position is "0" (zero element).

In the channel decoder 101, for the multinominal expression R (x)of the received word:

$$R(x) = R_{n-1}x^{n-1} + R_{n-2}x^{n-2} + \ldots + R_0$$

a syndrome multinominal expression is calculated:

$$S(x) = S_1 + S_2 x + \ldots + S_{d-1}x^{d-2}$$

$$S_d = R(\alpha^i).$$

Here, an error position multinominal expression $\sigma e(x)$, an error numeric value multinominal expression $\eta e(x)$, a erasure position multinominal expression $\sigma \epsilon(x)$, and a erasure numeric value multinominal expression $\eta \epsilon(x)$ are defined as follows:

$$\sigma e(x) = \Delta_{i \in Ee}(1-\alpha^i x)$$

$$\eta e(x) = X_{i \in Ee} e_i \alpha^i \Delta \alpha_{j \in Ee, j \neq i}(1-\alpha^i x)$$

$$\sigma \epsilon(x) = \Delta_{i \in E\epsilon}(1-\alpha^i x)$$

$$\eta \epsilon(x) = X_{i \in E\epsilon} e_i \alpha^i \Delta_{j \in E\epsilon, j \neq i}(1-\alpha^i x)$$

Here, the number of error symbols is expressed by Ne, the number of erasure symbols is expressed by N$\epsilon$:

Ee: Set of error positions $\{1e_1, 1e_2, \ldots, 1e_{Ne}\}$

E$\epsilon$: Set of erasure positions $\{1\epsilon_1, 1\epsilon_2, \ldots, 1\epsilon_{N\epsilon}\}$ $e_i$: error numeric value in position i $\epsilon_j$: erasure numeric value in position j Moreover, the error erasure position multinominal expression $\sigma(x)$ and error erasure numeric value $\eta(x)$ are defined as follows:

$$\sigma(x) = \sigma e(x) \cdot \sigma \epsilon(x)$$

$$\eta(x) = \sigma e(x) \cdot \eta \epsilon(x) + \sigma \epsilon(x) \cdot \eta e(x)$$

Here, $u\epsilon(x)$, $S(x)$ are known so that the following correction syndrome multinominal expression can be calculated from this:

$$S\epsilon(x) = \sigma\epsilon(x) \cdot S(x) \bmod x^{d-1}.$$

This $S\epsilon(x)$ satisfies the following expressions so that $\eta(x)$ and $\sigma e(x)$ can be obtained by any scheme:

$$\sigma e(x) \cdot S\epsilon(x) = \eta(x) \bmod x^{d-1}.$$

$$\deg[\sigma e(x)] \leq [(d-1-\epsilon)/2]$$

$$\deg[\eta(x)] < [(d-1+\epsilon)/2]$$

The expression shown above is called a basic correction equation. However, [x] is a maximum integer not exceeding x.

The error position 1e can be obtained from the root of $\sigma e(x) = 0$. Moreover, the error (erasure) numeric value at the position j satisfies the following expression so that it is possible to obtain the error (erasure) numeric value from the derived error (erasure) position.

$$e_j(\text{or } \epsilon_j) = \eta(\alpha^{-j})/\sigma'(\alpha^{-j})$$

Then, the procedure of decoding and solution of the basic equation are described below:

The euclid decoding scheme is known an effective error correction decoding scheme for GOPPA code (including BCH code and RS code), however, it is possible to configure a decoding scheme that can correct the erasure signal and erroneous signal at the same time by correcting the algorithm a little bit.

The decoding scheme of the euclid algorithm that correct the erasure number $N\epsilon$ and error number Ne at the same time.

(1) Initialize the received signal.

$R_i = 0$, $i = 1\epsilon_1, i = 1\epsilon_2, \ldots i = 1\epsilon_{N\epsilon}$ (2) Obtain the syndrome multinominal expression $S(x)$.

$$S(x) = S_1 + S_2 x + \ldots + S_{d-1} x^{d-2}$$

$S_i = R(\alpha^i)$ (3) Obtain the erasure position multinominal expression $\sigma\epsilon(x)$.

$$\sigma\epsilon(x) = \tau_{iE\epsilon}(1 - \alpha^i x)$$

(4) Obtain the correcting syndrome multinominal expression $S\epsilon(x)$.

$$S\epsilon(x) = \sigma\epsilon(x) \cdot S(x) \bmod x^{d-1}$$

Here, in the case where $\deg[S\epsilon(x)] < N\epsilon$, the procedure after (6) is conducted, with the number of errors Ne being 0, $S\epsilon(x)$, $\sigma e(x)$ are $\eta(x)$, $\sigma(x)$ respectively. For other cases, perform the procedure (5), assuming that there is an error.

(5) Solve the basic correction equation.

Obtain $\sigma e(x)$, $\eta(x)$ that satisfy the following expression from $S\epsilon(x)$.

$$\sigma e(x) \cdot S\epsilon(x) = \eta(x) \bmod x^{d-1}$$

$$\deg[\sigma e(x)] \leq [(d-1-\epsilon)/2]$$

$$\deg[\eta(x)] < [(d-1+\epsilon)/2]$$

(6) Calculate the error position.

The next number of $\sigma e(x)$ and $\deg[\sigma e(x)]$ are the number of errors Ne.

The root $\alpha^{1e}_1, \alpha^{-1e}_2, \ldots, \alpha-1e_{N_e}$ of number of Ne of $\sigma e(x) = 0$ indicates the error position $1_{e1}, 1_{e2}, \ldots, 1_{eNe}$.

Thus, the element of GF$(2^m)$ suitable for error position $(\alpha^0, \alpha^1, \ldots, \alpha^{n-1})$ is substituted in order to verify whether it is a root of $\sigma e(x)$ or not. Normally, a technique called chain search is used for this process.

Moreover, there is a case where $\sigma e(x) = 0$ does not have suitable numbers of roots of $\deg[\sigma e(x)]$. This happens when the received word has errors exceeding the correction capability $[(d-1-\epsilon)/2]$. In this case, the error is detected as a in-correctable error.

(7) Obtain the error and erasure position multinominal expression $\sigma(x)$.

$$\sigma(x) = \sigma e(x) \cdot \sigma\epsilon(x)$$

(8) Calculate the error and erasure numeric value.

Calculate the error numeric value $e_j$ and erasure numeric value $\epsilon_j$ in position j from the formal differentiation $\sigma'(x)$ and $\eta(x)$.

$$e_j = \eta(\alpha^{-j})/\sigma'(\alpha^{-j})$$

$$j \in Ee$$

$$\varepsilon_j = \eta(\alpha^{-j})/\sigma'(\alpha^{-j})$$

$$j \in E\varepsilon$$

(9) Execute the error correction.

Correct the error and loss appeared in the position j of the received word and obtain a composite word C.

$$C_j = \begin{cases} R_j + e_j & j \in Ee \\ R_j + \varepsilon_j & j \in E\varepsilon \\ R_j & j \in Ee \cup E\varepsilon \end{cases}$$

Among the decoding procedures described above, it is possible to use the euclid algorithm on a multinominal expression to solve the basic equation in (5) as in the case of error correction.

Described below is how to solve the basic equation in the euclid decoding scheme.

Deduce $\sigma e(x)$, $\eta(x)$ that satisfy the following equation for given $S\epsilon(x)$.

$$\sigma e(x) \cdot S\epsilon(x) = \eta(x) \bmod x^{d-1}$$

$$\deg[\sigma e(x)] \leq [(d-1-\epsilon)/2]$$

$$\deg[\eta(x)] < [(d-1+\epsilon)/2]$$

The initial state is assumed as:

$$r_{-1}(x) = x^{d-1}$$

$$r_0(x) = S(x)$$

$$u_{-1}(x) = 0$$

$$u_0(x) = 1$$

In the euclid algorithm, the following procedures are repeated for $i = 1, 2, \ldots$ (1) Obtain $r_i(x)$, $q_i(x)$ that satisfy the following expression.

$$r_{i-2}(x) = q_i(x) r_{i-1}(x) + r_i(x)$$

$$\deg[r_i(x)] < \deg[r_{i-1}(x)]$$

(2) Calculate $u_i(x)$ $$u_i(x)=q_i(x)u_{i-1}(x)+u_{i-2}(x)$$

(3) If deg $[r_i(x)] < [(d-1+\epsilon)/2]$,
h=i, and stop the procedure.
The error position multinominal expression will be as follows:

$$\sigma e(x)=\delta u_h(x)$$

However, $$\delta=\{u_h(0)\}^{-1}$$

Error numeric value multinominal expression is as follows:

$$\eta(x)=\delta r_h(x)$$

Figure 8:
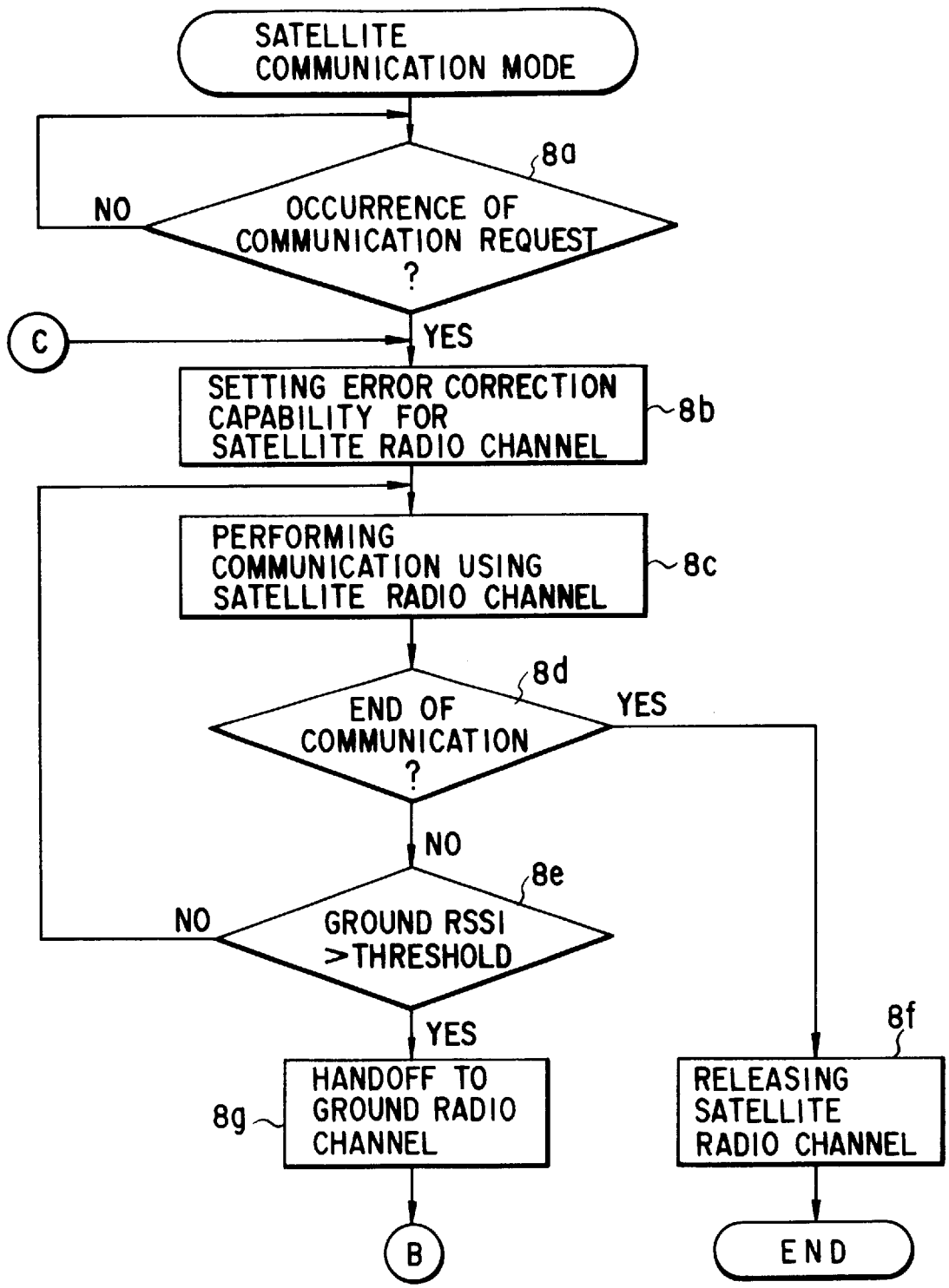
FIG. 8 is a flow chart showing the procedures of operation and contents of the satellite communication mode in the base station and mobile station shown in FIGS. 2 and 3.

Next, the operation of the system as configured above is described. FIG. 6 and FIG. 8 are the flow charts for illustrating the operation. In mobile stations MS1, MS2, . . . , when the power is on, the operation state of each unit is initialized in the step 6a as shown in FIG. 6, and then, RSSI on the satellite radio channel is detected in the step 6b. This RSSI on the satellite radio channel is detected to confirm that a mobile station is present within the service area of the communication satellite SAT. Then, RSSI on each ground-system radio channel is detected in the step 6c. It is evaluated whether or not there is any RSSI value on each ground-system radio channel which is larger than the threshold value in the step 6d, and, if any larger RSSI is found, that ground-system radio channel is selected as a standby channel, with the system shifting to the ground communication mode. On the other hand, if there is no ground radio channel whose RSSI detection value is larger than the threshold value, the satellite radio channel is selected, with the system shifting to the satellite communication mode.

For example, the mobile station MS1 shown in FIG. 1 is present within the radio zone E1 of the base station BS1 so that the base station BS1 selects the owing ground radio channel to shift to a standby (idle) state. Conversely, the mobile station MS2 is not included in radio zone E1, E2, . . . of any base stations BS1, BS2, . . . so that it selects a satellite radio channel, shifting to a standby state.

Figure 7:
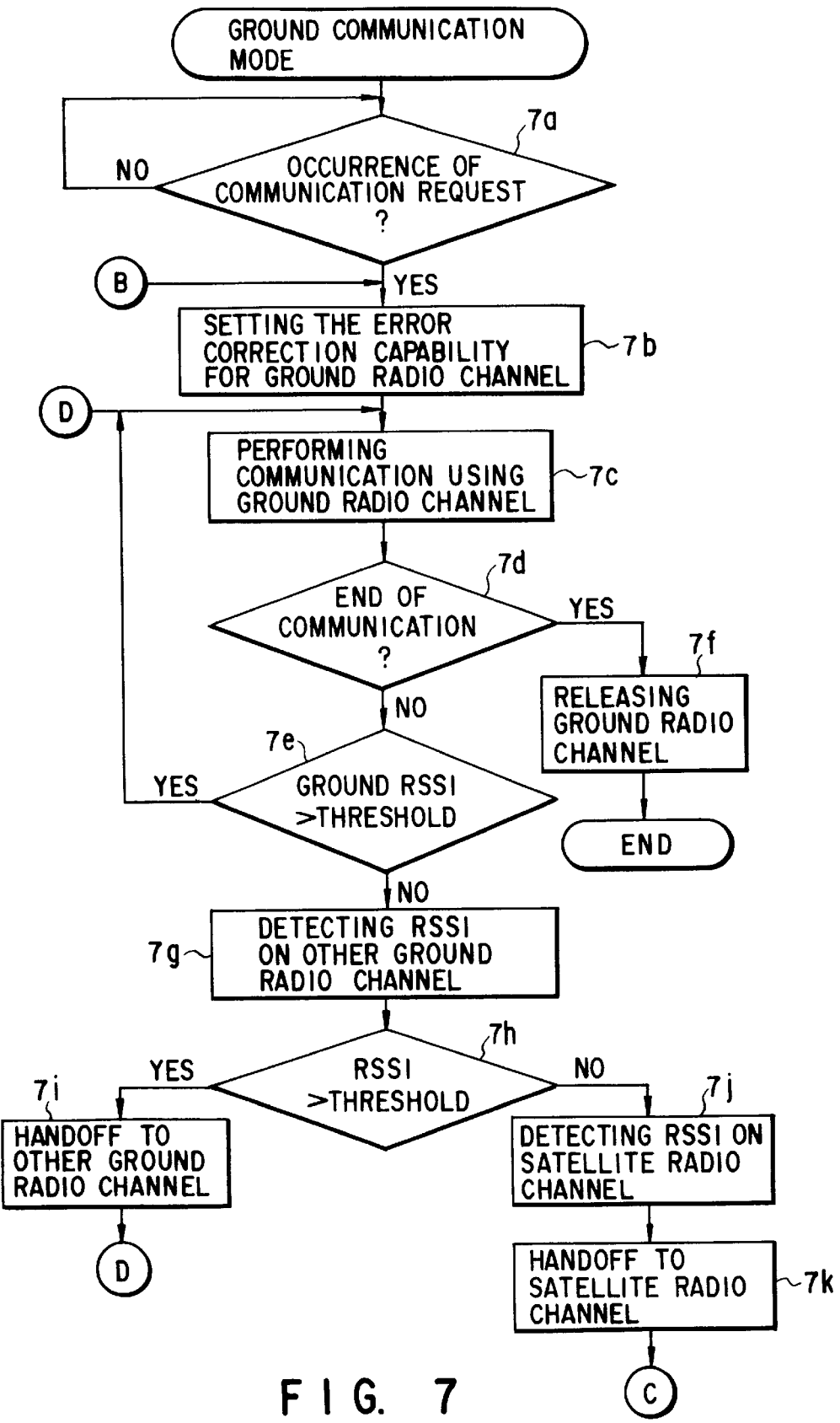
FIG. 7 is a flow chart showing the procedures of operation and contents of the ground communication mode in the base station and mobile station shown in FIGS. 2 and 3.

In the mobile station (for example, MS1) having shifted to the ground communication mode, the following operations are performed. Namely, it is monitored whether or not any communication request occurs that is accompanied by the originating or incoming call, in the step 7 as shown in FIG. 7. If any communication request occurs, a block code having correction capability suited for the communication using the ground radio channel is set for the channel codec 91 from the control section 10 in the step 7b. For example, when using Reed-Solomon (34, 20) code, the 2 erasure and 6 error correction will be selected among 8 kinds of correction capability as shown in FIG. 5 so as to set the code on the channel codec 91.

Then, in the step 7c, a ground radio channel is captured and the radio communication is conducted with the base station BS1 in TDMA-TDD scheme by using this ground radio channel thereafter. Moreover, also in the base station BS1, the Reed-Solomon code having said 2 erasure and 6 error correction capability is set to the channel codec 41 in the same way as in the case of said mobile station MS1, the communication with mobile station MS1 conducted in this state. FIG. 9B shows the transmission format of a signal that is sent and received between the mobile station MS1 and base station BS1 in this instance.

Therefore, in this ground communication mode, the Reed-Solomon code having said 2 erasure and 6 error correction capability is used to conduct the error correction encoding and decoding process prioritizing the code error correction process in the mobile station MS1 and also in base station BS1. Thus, the code error is effectively corrected that occurred while the information is transmitted via a ground radio channel.

In the mobile station MS1 during said communication, the end of communication is repeatedly monitored by the step 7d and the RSSI on the ground radio channel under service is repeatedly monitored by the step 7e. When the communication is terminated, the ground radio channel is released in the step 7f and a specified speech termination process is performed, thereby returning the system to a standby state in the ground communication mode.

Conversely, suppose that, for example, the mobile station MS1 moves from a radio zone E1 of the base station BS1 to a radio zone E3 of the other base station BS3 during communication. In that case, it will not be possible for the mobile station MS1 to receive the ground radio channel from the base station BS1. Thus, in the mobile station MS1, RSSI of other ground radio channel is detected in the step 7g while maintaining the communication to evaluate whether there is an available ground radio channel on the basis of that detection results in the step 7h. If there is any other available ground radio channel, the handoff operation is performed to that channel in the step 7i. For example, if the mobile station MS1 has moved to the radio zone E3 of the base station BS3 as described above, the handoff operation is performed to the ground radio channel that this base station BS3 owns. After this handoff operation, the communication is continued back to the step 7c in the ground communication mode.

On the other hand, if there is no other available ground radio channel, it is evaluated whether or not the satellite radio channel is available on the basis of the RSSI value on the satellite radio channel in the step 7j. When the channel is available, the ground radio channel that has been used is handed off to said satellite radio channel in the step 7k. Thereafter, the system is shifted to the satellite communication mode which is described in the next paragraph.

In the mobile station (for example, MS2) that is shifted to the satellite communication mode, the following operation is conducted. Thus, it is monitored whether or not any communication request occurs that is accompanied by the originating or incoming call, in the step 8a as shown in FIG. 8. If any communication request occurs, a block code having correction capability suited for the communication using the satellite radio channel is set for the channel codec 91 from the control section 10 in the step 8b. For example, when using Reed-Solomon (34, 20) code, the 12 erasure and 1 error correction will be selected among 8 kinds of correction capability as shown in FIG. 5 so as to set the code on the channel codec 91.

Then, in the step 8c, a satellite radio channel is captured and the radio communication is conducted, for example, with the base station BS2 in TDMA-TDD scheme via a communication satellite SAT thereafter. Moreover, also in the base station BS2, the Reed-Solomon code having said 12 erasure and 1 error correction capability is set to the channel codec 41 in the same way as in the case of said mobile station MS1, the communication with mobile station MS2 conducted via the communication satellite SAT in this state. FIG. 9A shows the transmission format of a signal that is sent and received between the mobile station MS2 and base station BS2 in this instance.

Therefore, in this ground communication mode, the Reed-Solomon code having said 12 erasure and 1 error correction capability is used to conduct the erasure signal correction encoding and decoding process prioritizing the loss correction capability also in the mobile station MS2 and also in the base station BS2. Thus, the receiving timing of the receiving slot changes from the timing shown in FIG. 10, for example, to the timing shown in FIG. 10B, as the communication satellite SAT moves, so that, even if the receiving slot timing overlaps with the transmission slot timing, resulting in that a part of the received information is erasure, that erasure information is restored by said erasure signal correction encoding and decoding process.

In the mobile station MS2 during said communication, the end of communication is repeatedly monitored by the step 8d and the RSSI on the ground radio channel is repeatedly monitored by the step 8e. When the communication is terminated, the satellite radio channel is released in the step 8f and a specified speech termination process is performed, thereby returning the system to a standby state in the satellite communication mode.

On the other hand, suppose that, for example, the mobile station MS2 moves to a radio zone E2 of the base station BS2 during communication. In that case, it will be possible for the mobile station MS2 to receive the ground radio channel from the base station BS2. When the mobile station MS2 detects that this ground radio channel is made possible to receive the ground radio channel from the base station BS2 in the step 8e, it shifts to the step 8g to perform the handoff operation from the satellite radio channel to the ground radio channel. Then, it shifts to the step 7b to change the block code used by the channel codec 91 to the Reed-Solomon code having the 2 erasure and 6 error correction capability suited to the ground radio channel, thereby performing the communication on the ground communication mode.

Thus, the communication is conducted by prioritizing the ground radio channel. By doing so, it is possible to effectively utilize the a few satellite radio channels in comparison with the ground-system radio channels in general.

Then, if there are sufficient numbers of satellite radio channels, it is allowed to continue the communication using the satellite radio channel without performing the handoff operation even if the ground radio channel satellite radio channel are available while a mobile station is under communication.

(Second embodiment)

The second embodiment of this invention is a system in which the radio communication is performed between the base stations BS1, BS2, . . . and mobile stations MS1, MS2, . . . by selectively using a ground radio channel and a satellite radio channel where a connecting code is used as a error correction code and the configuration of said connecting code is variably set according to which of said ground radio channel or satellite radio channel is selected.

FIG. 11 is a circuit block diagram showing the configuration of the channel codec relating to this embodiment. In this figure, the channel encoder 201 consists of a folding encoder 211, a Reed-Solomon encoder 212, a adder 213, and four change-over switches. Among them, the capability of the convolutional code that is used by the folding encoder 211 is fixed, however, the correction capability of the Reed-Solomon code that is used by the Reed-Solomon encoder 212 is set by the control signal fed from the control section 5', 10'. The adder 213 is used for insert a tail bit into the series of digital information. The state of each change-over switch 214–217 is controlled by the control section 5', 10'.

Next, the channel decoder 202 consists of a viterbi decoder 221, a Reed-Solomon decoder 222, a subtracter 223, and four change-over switches 224–227. Among them, the correction capability of the viterbi decoder 221 is fixed, however, the correction capability of the Reed-Solomon decoder 222 is variably set by the control section 5', 10'. The subtracter 223 is used to delete the tail bit from the series of received signal. The state of each change-over switch 224–227 is controlled by the control section 5', 10'.

When the communication is conducted, at first, through a ground radio channel in such a configuration, the Reed-Solomon code having the code error correction capability suited for the ground radio channel is set for the Reed-Solomon encoder 212 and the Reed-Solomon decoder 222 from the control section 5', 10'. For example, a Reed-Solomon code having 2 erasure and 6 error correction capability will be set. Moreover, the folding encoder 211 uses, for example, a convolutional code with encoding ratio of 1/2 and constraint length of 8. Furthermore, each change-over switch 214–217, 224–227 is each set to "a" side with a change-over signal from the control section 5', 10'.

Therefore, during communication, the digital sending speech signal fed from the PCM codec 42, 92 is fed into the Reed-Solomon encoder 212 through the change-over switch 216, and the signal is encoded by every block of 120 bits with Reed-Solomon (34, 20) code here to be a encoded digital signal of 204 bits. In this instance, the error correction capability of the Reed-Solomon code is set to 2 erasure and 6 error correction, thereby performing the error correction encoding prioritizing the code error correction.

Said encoded digital signal is, then, fed to the adder 213 through the change-over switch 217, 214 to be fed to the folding encoder 211 after a tail bit of 7 bits is added here. In this folding encoder 211, the digital signal having been 211 bits through the addition of said tail bit is folding-encoded with the convolutional code. The encoded digital signal having been 422 bits with this folding encoding process is fed to TDMA encoder 32, 82 via the change-over switch 215. FIG. 12A shows the encoding operation in time series as described above.

In contrast to this, the digital decoding signal fed from TDMA decoder 31, 81 is fed to the viterbi decoder 221 through the change-over switch 224 to be error correction-decoded here. The digital decoded signal of 211 bits that is error correction-decoded is fed to the Reed-Solomon decoder 222 via change-over switch 225, 226 after the tail bit of 7 bits removed in the subtracter 223. In this Reed-Solomon decoder 222, said digital decoding signal undergoes the decoding process based on the Reed-Solomon code having the 2 erasure and 6 error correction capability. Namely, a decoding prioritizing the code error correction is performed. The decoded digital demodulation signal is fed to PCM codec 42, 92 via the change-over switch 227.

Namely, when conducting the communication by using a ground radio channel, the base stations BS1, BS2, . . . and mobile stations MS1, MS2, . . . perform the error correction encoding and decoding process by using the connecting code where the Reed-Solomon code serves as an outside code, and the convolutional code serves as an inside code, with a connecting code in which the correction capability of Reed-Solomon code itself is prioritizing the code error correction. Therefore, corrective encoding and decoding are done which is prioritizing the code error correction suited for the propagation characteristics of the ground radio channel, thereby allowing a high-quality radio transmission.

On the other hand, when the communication via the satellite radio channel is performed, the Reed-Solomon code having erasure code correction capability suited for the satellite radio channel is set on the Reed-Solomon encoder 212 and Reed-Solomon decoder 222 from the control section 5', 10'. For example, the Reed-Solomon code having 12 erasure and 1 error correction capability suited for the satellite radio channel is set. Moreover, the folding encoder 211 uses a convolutional code with the encoding ratio of 1/2 and constraint length of 8 the same as in the case of using said ground radio channel. Also, each change-over switch 214–217, 224–227 is set to "b" side with the change-over control signal from the control section 5', 10'.

Therefore, during communication, the digital sending speech signal fed from the PCM codec 42, 92 is fed into the adder 213 through the change-over switch 214, encoded by every block of 53 bits, and fed into the folding encoder 211 after the tail bit of 7 bit is added. In the folding encoder 211, the digital sending speech signal of 60 bits fed from said adder 213 is encoded with the convolutional code of said encoding ratio of 1/2 and constraint length of 8.

Thus, the digital speech signal having been 120 bits through this folding encode process is fed to the Reed-Solomon encoder 212 via the change-over switch 215, 216 to be encoded with the Reed-Solomon code. In this instance, the correction capability of the Reed-Solomon code is set to 12 erasure and 1 error correction, thereby conducting the code correction encoding prioritizing the erasure code correction. The digital sending speech signal having been 204 bits with the Reed-Solomon encoding is fed to the TDMA encoder 32, 82. FIG. 12B shows the encoding operation in time series.

In contrast to this, the digital decoding signal fed from TDMA decoder 31, 81 is, at first, fed to the Reed-Solomon decoder 222 through the change-over switch 226. In this Reed-Solomon decoder 222, on said digital decoding signal undergoes the decoding process based on the Reed-Solomon code having the 12 erasure and 1 error correction capability. Namely, a decoding that is prioritizing the code error correction is performed. The decoded digital demodulation signal is fed to the viterbi decoder 221 via the change-over switch 227, 224, and then is error correction-decided. Thus, this error correction-decoded digital demodulation signal of 60 bits whose tail bit of 7 bits is removed in the subtracter 223, then, is fed to the PCM codes 42, 92 via the change-over switch 225.

Namely, when conducting the communication by using a satellite radio channel, the base stations BS1, BS2, . . . and mobile stations MS1, MS2, . . . performs the error correction encoding and decoding process by using the connecting code where the convolutional code serves as an outside code, and the Reed-Solomon code serves as an inside code, with a connecting code in which the correction capability of Reed-Solomon code itself is prioritizing the erasure code correction. Therefore, corrective encoding and decoding are done which is prioritizing the erasure code correction being suited for the propagation characteristics of the satellite radio channel, and also, on the signal after the erasure code correction undergoes the error correction process by using the convolutional code, thereby allowing a high-quality radio transmission of no information-loss and less code error without accurately controlling the timing of the transmission slot, and also without providing a large guard time.

(Third embodiment)

The third embodiment of this invention is that the encoding and decoding process for erasure code correction is conducted in the base stations BS1, BS2, . . . and mobile stations MS1, MS2, . . . respectively and also on the transponder for the communication satellite SAT.

Figure 13:
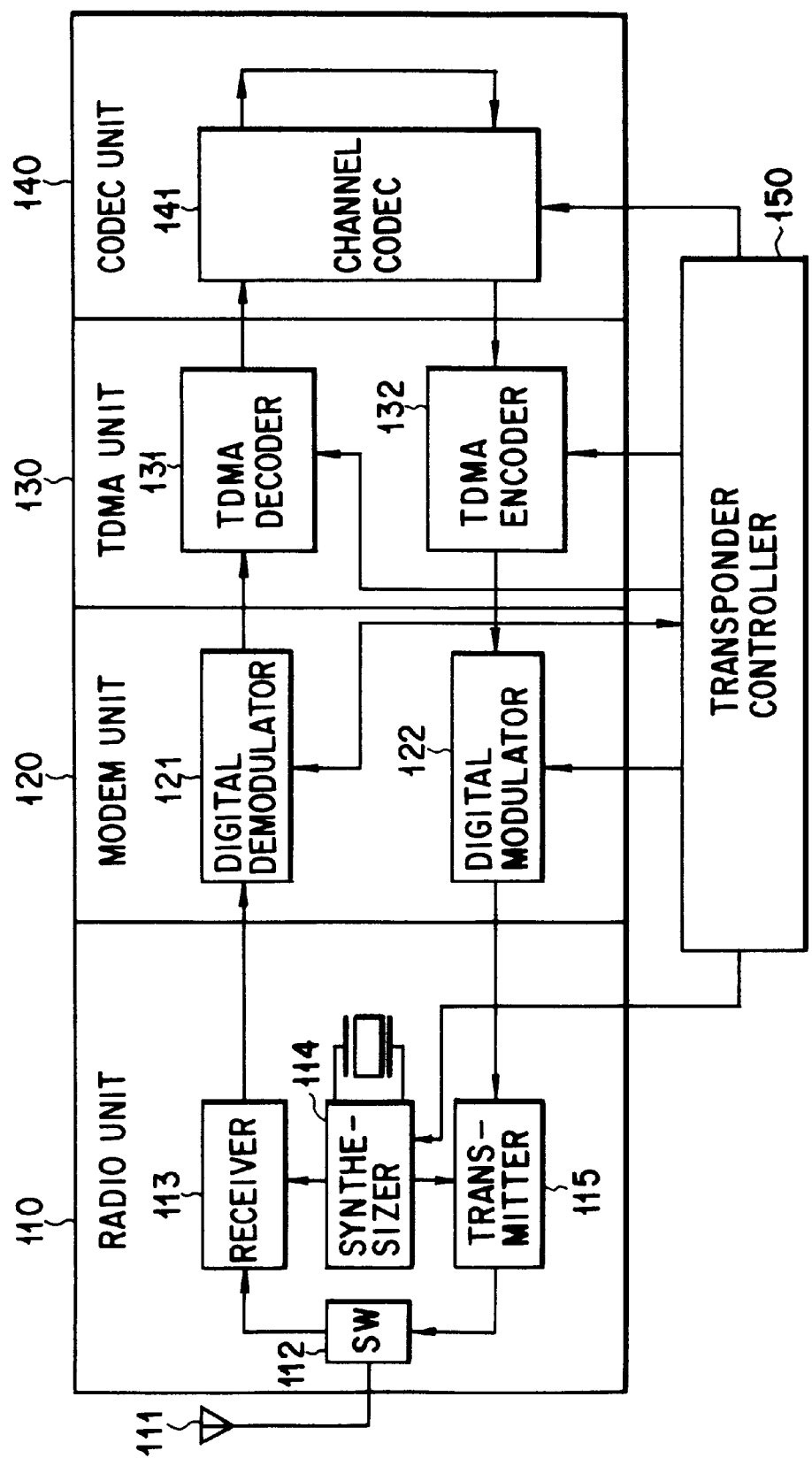
FIG. 13 is a circuit block diagram showing the transponder to be mounted on the satellite relating to the third embodiment in this invention.

FIG. 13 is a block diagram showing the configuration of the transponder. In this figure, the radio carrier wave signal coming from the base stations BS1, BS2, . . . and mobile stations MS1, MS2, . . . is received by an antenna 111 and fed into the receiving section 113 via a high-frequency switch (SW) 112 in the radio unit 110. In this receiving unit 113, said received radio carrier wave signal is, after amplified in the low-noise amplifier, mixed with the received local oscillating signal generated from the frequency synthesizer 114 to be down-converted into the received intermediate frequency signal or received base band signal. Moreover, the local oscillating frequency generated from said frequency synthesizer 114 is instructed from the transponder control section 150.

The received intermediate frequency signal or received base band signal fed from said receiving section 113 is fed to the digital modulation section 121 in a modem unit 120. This digital demodulation section 21 digital-demodulates said received intermediate frequency signal or received base band signal. In the TDMA decoding section 31 of the TDMA unit 3, the digital demodulation signal is decomposed in accordance with the instruction of the control section 150 by each time slot, and this decomposed digital demodulation signal is fed to the codec unit 140.

The codec unit 140 is provided with a channel codec 141. This channel codec 141 consists of a channel encoder 101 and a channel decoder 102 as described in the previous FIG. 4. In the channel decoder 102, on said digital speech signal fed from said TDMA decoding section 131 undergoes the decoding process for erasure code correction. Then, this decoded digital demodulation signal is fed to the channel encoder 11. This channel encoder 101 performs coding process for erasure code correction on said digital demodulation signal.

The TDMA encoding section 132 inserts the digital demodulation signal fed from said channel encoder 101 in receiving order. In the digital modulation section 122, the digital modulated modulated wave signal is generated by the digital demodulation signal fed from said TDMA encoding section 132, and this modulated wave signal is fed to the transmitting section 115. In the transmitting section 115, said modulated wave signal is mixed with the transmission local oscillating signal generated from the frequency synthesizer 114 to be frequency-converted into a radio channel frequency instructed by the transponder control section 150, and further amplified to a specified transmission power level. The radio frequency signal fed from this transmitting section 115 is transmitted from an antenna 111 via the high-frequency switch 12 to the ground.

Meanwhile, a block code having the erasure code correction capability for the satellite radio channel is set to the channel encoder 101 and channel decoder 102 of said channel codec 141. The 12 erasure code correction and 1 error correction as same as that used by the base station and mobile station in said first embodiment is used for the correction capability of this block code.

In such configuration, after undergoing the low-noise amplification, digital demodulation, and time slot separation,the radio carrier wave signal sent via the satellite radio channel from the mobile station and base station is erasure code correction-decoded in the channel codec 140 on the basis of Reed-Solomon code, thereby restoring the erasure information. On this erasure signal corrected digital demodulation signal undergoes the erasure code correction with the Reed-Solomon code in the channel codec 140, and, after the re-arrangement of the time slot, digital modulation, up-convert into a radio carrier wave frequency, and transmission amplification are performed in order, is transmitted to the base station and mobile station.

Therefore, the erasure code correction process is conducted not only on the mobile station and base station but also on the communication satellite SAT to restore the erasure information, thereby making it possible to further enhance the capability of the erasure code correction in comparison with the case where the erasure code correction is conducted only on the mobile station and base station, with further improved transmission quality.

Moreover, this invention is not limited to said each embodiment. For example, in the said embodiment, the invention is described in the case where the mobile station and base station are connected via a satellite radio channel as example, however, it possible to connect the mobile stations via the satellite radio channel.

Moreover, in each embodiment as described above, the Reed-Solomon (32, 20) code is used as a block code to change the ratio between the number of erasure code correction bits and number of the error correction bits according to the kinds of the selected radio channel, however, it is possible to select the other block code differing in the erasure code correction capability according to the kind of the selected radio channel. As an example, it is possible to introduce Reed-Solomon code and BCH code.

Moreover it is possible that the-quality of the transmission line or the position of the communication satellite SAT is monitored during communication so as to variably change the ratio between the number of erasure code correction bits and the number of error correction bits in the block code in accordance with the results of monitoring. For example, when the communication satellite SAT is present in a position where no information will be erasure, the number of erasure code correction bits in the block code is reduced, and the number of error correction bits is increased conversely. On the other hand, when the communication satellite SAT is present in a position where the information will be erasure, the number of erasure code correction bits is increased, and the number of error correction bits is decreased. In such a way, it is possible to conduct further effective error correction according to the transmission quality of the satellite radio channel.

Furthermore, it is possible to use FDMA-TDD scheme as a access scheme for the ground radio channel and satellite radio channel. It is possible to change the kinds of error correction code, procedures of the handoff, configuration of the mobile station and base station and configuration of the transponder for the communication satellite, etc. for practice without deviating from the principle of this invention.

Furthermore, the FDMA-TDD scheme may be employed as an access scheme for accessing ground radio channels and satellite radio channels. In addition, as regards the types of the error correction codes, the procedure of the hand-off operation, the structures of the mobile station and the base station, the structure of the satellite radio transponder, etc., the invention can be modified in various manners without departing from the scope thereof.

It is a matter of course that the CDMA-TDD scheme can be used as an access scheme for accessing the ground radio channels and the satellite radio channels.

In this case, the TDMA unit shown in FIGS. 3 and 13 is replaced with a CDMA unit capable of performing diffusion-modulation and -demodulation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A radio communication system wherein, the radio communication is conducted in TDD scheme via a radio channel between a first radio station and a second radio station, at least, either of which is movable, comprising:

said first radio station including:
error correction encoding means for encoding a series of input digital information by using a first error correction code having a predetermined error correction capability;
erasure correction encoding means for encoding the series of digital information encoded by said error correction encoding means by using a second error correction code having a predetermined erasure correction capability; and
transmitting means for transmitting the series of digital information coded by said encoding means over said radio channel within a predetermined transmission period, after modulating it with a predetermined digital modulation scheme; and said second radio station including:
receiving means for outputting a demodulated signal by digitally demodulating it, after receiving the radio signal coming from within a predetermined receiving period via said radio channel;
erasure correction decoding means for restoring erasure data by performing an erasure correction decoding process on the demodulated signal outputted from said receiving means, on the basis of said second error correction code; and
error correction decoding means for performing an error correction process on the demodulated signal undergone the erasure correction decoding process by said erasure correction decoding means by using said first error correction code, said error correction encoding means performing the error correction encoding process on the series of input digital information by using a convolutional code, said erasure correction encoding means performing the erasure correction encoding process on the series of digital information undergone the error correction encoding process performed by said error correction encoding means, by using a block code, said erasure correction decoding means performing the erasure correction process on the demodulated signal on the basis of said block code, and said error correction decoding means performing the error correction process on the demodulated signal undergone the erasure correction process performed by said erasure correction decoding means, by using a viterbi decoder.

2. A radio communication apparatus for performing a radio communication in TDD scheme via a radio channel, comprising:

encoding means including:
error correction encoding means for encoding a series of input digital information by using a first error correction code having a predetermined error correction capability; and
erasure correction encoding means for encoding the series of digital information having been encoded by said error correction encoding means by using a second error correction code having a predetermined erasure correction capability;

transmitting means for transmitting the series of digital information having been encoded by said encoding means over said radio channel within a predetermined transmitting period, after modulating it with a predetermined digital modulation scheme;

receiving means for outputting a demodulated signal by digital demodulation after receiving the radio signal coming from within a predetermined receiving period via said radio channel; and decoding means including:

erasure code correction decoding means for restoring erasure data by performing an erasure correction decoding process on the demodulated signal outputted from said receiving means, on the basis of said second error correction code; and error correction decoding means for performing an error correction process on the demodulated signal undergone the erasure correction decoding process conducted by said erasure correction decoding means, by using said first error correction code, said error correction encoding means performing the error correction encoding process on the series of input digital information by using a convolutional code, said erasure correction encoding means performing the erasure correction encoding process on the series of digital information undergone the error correction encoding process performed by said error correction encoding means, by using a block code having the predetermined erasure correction capability, said erasure correction decoding means performing the erasure correction process on the demodulated signal on the basis of said block code, and said error correction decoding means performing the error correction process on the demodulated signal undergone the erasure correction process performed by said erasure correction decoding means, by using a viterbi decoder.

3. A radio communication system comprising:

a plurality of base stations arranged in a service area and connected to wired communication network;

a plurality of mobile stations performing radio communication between a base station selected among them in TDD scheme via ground-system radio channel; and at least one orbiting satellite for performing the radio relay communication between said mobile station and base station or between mobile stations via satellite-system radio channel in TDD scheme with selective connection;

each of said plurality of mobile stations and plurality of base stations including:

radio channel selection means for selecting whether communication should be performed via said ground-system radio channel or said satellite-system radio channel;

code selection means for selecting a first error correction code for giving priority to an error correcting capability if the ground-system radio channel is selected by said radio channel selection means, and selecting a second error correction code for giving priority to an erasure data correction capability if the satellite-system radio channel is selected by said radio channel selection means;

encoding means for encoding input digital series, using said first and second error correction code selected by said code selection means;

transmitting means for modulating the digital data series encoded by said encoding means in a predetermined digital modulation scheme, and then transmitting, within a predetermined transmission period the modulated digital data series to said ground-system radio channel or satellite-system radio channel selected by said radio channel selection means;

receiving means for receiving a radio signal having reached within a predetermined receiving period via said ground-system or satellite-system radio channel, then demodulating the received signal, and outputting the demodulated signal; and decoding means for subjecting the demodulated signal output from said receiving means, to decoding processing based on said first error correction code wherein error correction is a matter of priority, if said first error correction code is selected by said code selection means, and for subjecting the demodulated signal output from said receiving means, to decoding processing based on said second error correction code wherein erasure data correction is a matter of priority, if said second error correction code is selected by said code selection means, thereby restoring erasure data whose reception has failed within said predetermined receiving period.

4. A radio communication system according to claim 3, wherein:

said orbiting satellite includes:

relay receiving means for outputting the demodulated signal by digital demodulating the radio signal coming within a specified relay receiving period via said satellite-system radio channel after receiving it;

relay decoding means for restoring the erasure data not received within a predetermined relay receiving period by conducting the decoding process prioritizing the erasure data correction on the demodulated signal outputted from said relay receiving means, on the basis of said second error correction code;

relay encoding means for encoding the series of signals undergone the erasure data correction decoding process conducted by said relay decoding means by using a relay error correction code having a predetermined erasure data correction capability; and relay transmission means for transmitting the series of signals encoded by said relay encoding means to said satellite-system radio channel during the relay transmission period after modulating it in a predetermined digital modulation scheme.

5. A radio communication system according to claim 3, wherein:

said code selection means selects the block code as an outside code and the convolutional code as an inside code when the ground-system radio channel is selected by the radio channel selection means, said encoding means, at first, encodes the input digital series by using said block code, and then, encodes the encoded digital series after the encoding by using said convolutional code;

said decoding means, at first, performs the error correction decoding process on the demodulated signal outputted from said receiving means by using the viterbi decoder, then, performs the decoding process on the series of signals undergone the error correction decoding process on the basis of said block code.

6. A radio communication system according to claim 3 wherein:

said code selection means selects the block code as an inside code and the convolutional code as an outside code when the satellite-system radio channel is selected by said radio channel selection means;

said encoding means, at first, performs the error correction encoding process on the input digital series by using said convolutional code, and then, performs the encoding process on the input digital series after the encoding process by using said block code; and said decoding means, at first, performs the decoding process prioritizing the erasure data correction on the demodulated signal outputted from said receiving means on the basis of said block code so as to restore the erasure data not received within said receiving period, then, performs the error correction decoding process on the series of signals after that decoding process by using said convolutional code.

7. A radio communication system according to claim 3, wherein:

said radio channel selection means measures the receiving quality on the ground-system radio channel, selects the ground-system radio channel when the measured receiving quality satisfies predetermined conditions, and selects the satellite-system radio channel when it does not satisfy the conditions.

8. A radio communication system according to claim 3, wherein:

said radio channel selection means including:

monitoring means for monitoring the receiving quality on the ground-system radio channel under communication in a period when a communication is established with the base station via the ground-system radio channel, and for evaluating whether or not the receiving quality satisfies predetermined condition; and first radio channel change-over means for changing the ground-system radio channel under communication to the satellite-system radio channel while maintaining the communication state when said monitoring means evaluates that the receiving quality does not satisfy predetermined condition.

9. A radio communication system according to claim 3, wherein:

said radio channel selection means includes:

first evaluation means for measuring the receiving quality on the ground-system radio channel in a period when communication is established via the satellite-system radio channel and, based on the measuring results, evaluates whether or not there is the ground-system radio channel whose receiving quality satisfies predetermined condition; and second radio channel change-over means for changing said satellite-system radio channel under communication to said ground-system radio channel when it is evaluated by said first evaluation means that there is the ground-system radio channel whose receiving quality satisfies predetermined condition.

10. A radio communication system according to claim 3, wherein:

said radio channel selection means includes:

monitoring means for monitoring the receiving quality on the ground-system radio channel under communication in a period when communication is established with the base station via the ground-system radio channel so as to evaluate whether or not the receiving quality satisfies predetermined condition;

second evaluation means for measuring the receiving quality on the other ground-system radio channel transmitted from other base station than that currently under communication so as to evaluate whether or not there is other ground-system radio channel whose receiving quality satisfies predetermined condition on the basis of these measurement results;

third radio channel change-over means for changing the ground-system radio channel under communication to the other ground-system radio channel while maintaining the communication state when it is evaluated by said monitoring means that the receiving quality does not satisfy predetermined condition, and it is evaluated by said second evaluation means that there is other ground-system radio channel whose receiving quality satisfies predetermined condition; and fourth radio channel change-over means for changing the ground-system radio channel under communication to the satellite-system radio channel while maintaining the communication state when it is evaluated by said monitoring means that the receiving quality does not satisfy predetermined condition, and it is evaluated by said second evaluation means that there is no other ground-system radio channel whose receiving quality satisfies predetermined condition.

11. A radio communication apparatus for use in a radio communication system which performs TDD-scheme radio communication by selectively connecting, via a satellite-system radio channel, a plurality of radio communication apparatuses capable of performing TDD-scheme radio communication via a ground-system radio channel, the radio communication apparatus comprising:

radio channel selection means for selecting whether communication should be performed via said ground-system radio channel or said satellite-system radio channel;

code selection means for selecting a first error correction code for giving priority to an error correcting capability if the ground-system radio channel is selected by the radio channel selection means, and selecting a second error correction code for giving priority to an erasure data correcting capability if the satellite-system radio channel is selected by the radio channel selection means;

encoding means for encoding input digital data series, using said first or second error correction code selected by said code selection means;

transmission means for modulating the digital data series encoded by said encoding means in a predetermined modulation scheme, and then transmitting, within a predetermined transmission period, the modulated digital data series to said ground-system or satellite-system radio channel selected by said radio channel selection means;

receiving means for receiving a radio signal having reached within a predetermined receiving period via said ground-system or satellite-system radio channel, then demodulating the received signal, and outputting the demodulated signal; and decoding means for subjecting the demodulated signal output from said receiving means, to decoding processing based on said first error correction code wherein error correction is a matter of priority, if said first error correction code is selected by said code selection means, and for subjecting the demodulated signal output from said receiving means, to decoding processing based on said second error correction code wherein erasure data correction is a matter of priority, if said second error correction code is selected by said code selection means, thereby restoring erasure data whose reception has failed within said predetermined receiving period.

12. A radio communication system comprising:

a first radio station and second radio station, at least, either of which is movable; and at least one orbiting satellite for relaying a radio signal transmitted between those radio stations in a TDD scheme;

said first radio station including:

encoding means for encoding a series of input digital information by using an error correction code having a predetermined erasure correction capability and including error correction encoding means for encoding the series of digital information by using a first error correction code having predetermined error correction capability, and erasure correction encoding means for encoding the series of digital information encoded by said error correction encoding means by using a second error correction code having a predetermined erasure correction capability, wherein the error correction encoding means and the erasure correction encoding means perform encoding processes using a first convolutional code and a first block code, respectively; and transmitting means for transmitting the series of digital information encoded by said encoding means to said orbiting satellite within a predetermined transmitting period, after modulating the series of digital information in a predetermined digital modulation scheme;

said orbiting satellite including:

relay receiving means for digital-demodulating the radio signal coming from said first radio station within a predetermined relay receiving period, after receiving the radio signal, and outputting the demodulated signal;

relay decoding means for restoring erasure data not received within said predetermined relay receiving period, by performing the erasure correction decoding process on the demodulated signal outputted from said relay receiving means, on the basis of said error correction code, and including erasure correction decoding means for relay for restoring the erasure data, at first, by performing the erasure correction decoding process on the demodulated signal outputted from said relay receiving means on the basis of said second error correction code and based on a second block code, and error correction decoding means for relay for performing the correction process on the series of digital signals undergone the error correction process conducted by said erasure correction decoding means for relay, by using said first error correction code and using a first viterbi decoder;

relay encoding means for encoding the series of signals undergone the erasure correction decoding process conducted by said relay decoding means, by using a relay error correction code having a predetermined erasure correction capability, and including error correction encoding means for relay for error correction encoding the series of digital signals encoded by said error correction decoding means for relay, by using the first relay error correction code having the predetermined error correction capability, and erasure correction encoding means for relay for encoding the series of digital signals encoded by said error correction encoding means for relay, by using the second relay error correction code having the predetermined erasure correction capability, wherein the error correction encoding means for relay and the erasure correction encoding means for relay perform encoding processing using a second convolutional code and a third block code, respectively; and relay transmission means for transmitting the series of signals encoded by said relay encoding means to said second radio station, within the predetermined relay transmitting period, after modulating the series of signals in the predetermined digital modulation scheme;

said second radio station including:

receiving means for outputting the demodulated signal by digital demodulation, after receiving the radio signal coming from said orbiting satellite within a predetermined receiving period; and decoding means for restoring the erasure information not received within said predetermined receiving period by decoding the erasure correction decoding process on the demodulated signal outputted from said receiving means on the basis of said relay error correction code, and including erasure correction decoding means for restoring the erasure data, by performing the erasure correction decoding process on the demodulated signal outputted from said receiving means on the basis of said second relay error correction code and based on a fourth block code, and error correction decoding means for performing the error correction process on the demodulated signal undergone the erasure correction decoding process conducted by said erasure correction decoding means, by using said first relay error correction code and using a second viterbi decoder.

* * * * *